(12) United States Patent
Winder et al.

(10) Patent No.: US 6,720,114 B1
(45) Date of Patent: Apr. 13, 2004

(54) METHOD OF FORMING AN ALTERNATING PHASE SHIFT CIRCUITRY FABRICATION MASK, METHOD OF FORMING A CIRCUITRY FABRICATION MASK HAVING A SUBTRACTIVE ALTERNATING PHASE SHIFT REGION, AND ALTERNATING PHASE SHIFT MASK

(75) Inventors: Amy A. Winder, Idaho City, ID (US); Paul Chipman, Round Rock, TX (US)

(73) Assignee: Micron Technology, Inc., Boise, ID (US)

( * ) Notice: Subject to any disclaimer, the term of this patent is extended or adjusted under 35 U.S.C. 154(b) by 295 days.

(21) Appl. No.: 09/643,005

(22) Filed: Aug. 21, 2000

(51) Int. Cl.$^7$ ............................... G03F 9/00; G03C 5/00
(52) U.S. Cl. ............................ 430/5; 430/22; 430/323; 430/324
(58) Field of Search ............................. 430/5, 22, 323, 430/324

(56) References Cited

U.S. PATENT DOCUMENTS

| | | | |
|---|---|---|---|
| 5,376,483 A | 12/1994 | Rolfson | |
| 5,487,963 A | 1/1996 | Sigawara | |
| 6,007,950 A | 12/1999 | Lin | |
| 6,410,191 B1 * | 6/2002 | Nistler et al. | 430/5 |
| 6,416,907 B1 | 7/2002 | Winder et al. | |
| 6,534,223 B1 | 3/2003 | Yang | |
| 2002/0160278 A1 | 10/2002 | Winder et al. | |

FOREIGN PATENT DOCUMENTS

JP      08-022113 A      1/1996

OTHER PUBLICATIONS

Uwe A. Griesinger et al., "Transmission & Phase Balancing of Alternating Phase Shifting Masks (5X) —Theoretical & Experimental Results", SPIE99 #3873–36, pp. 1–11. 1999.

Christophe Pierrat et al., "Phase–Shifting Mask Topography Effects on Lithographic Image Quality", SPIE vol. 1927 Optical/Laser Microlithography VI (1993), pp. 28–41.

Rich Ferguson, "Imagine Imbalance", Optical Extensions Workshop May 13–14, 1999, 9 pages.

* cited by examiner

Primary Examiner—Mark F. Huff
Assistant Examiner—Saleha Mohamedulla
(74) Attorney, Agent, or Firm—Wells St. John P.S.

(57) ABSTRACT

Disclosed are methods of forming alternating phase shift circuitry fabrication masks, methods of forming circuitry fabrication masks having a subtractive alternating phase shift region, and alternating phase shift masks. In one implementation, a method of forming an alternating phase shift circuitry fabrication mask incudes combining circuitry pattern data biasing and wet undercut etching of light transmissive substrate material adjacent phase shift regions of the mask in fabricating the mask. In one implementation, a method of forming an alternating phase shift circuitry fabrication mask includes combining circuitry pattern data biasing and wet undercut etching of light transmissive substrate material adjacent phase shift regions of the mask effective to achieve a first data biased pattern when using the mask to fabricate circuitry of a desired circuit pattern on another substrate. The first data biased pattern has at least some first resolution spacing falling between a discrete finite resolution spacing of which a writing tool used to fabricate the mask is capable of achieving.

45 Claims, 4 Drawing Sheets

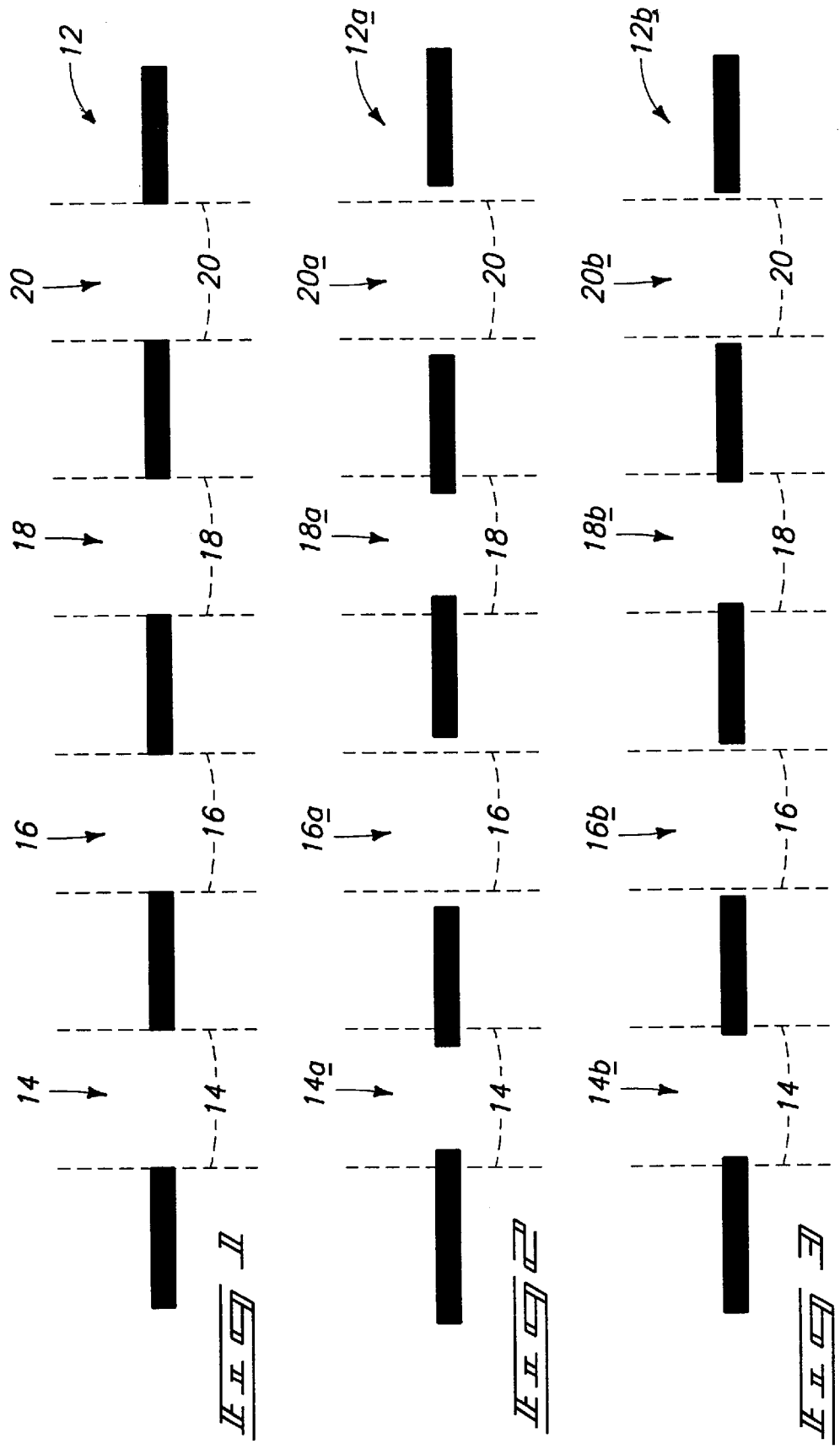

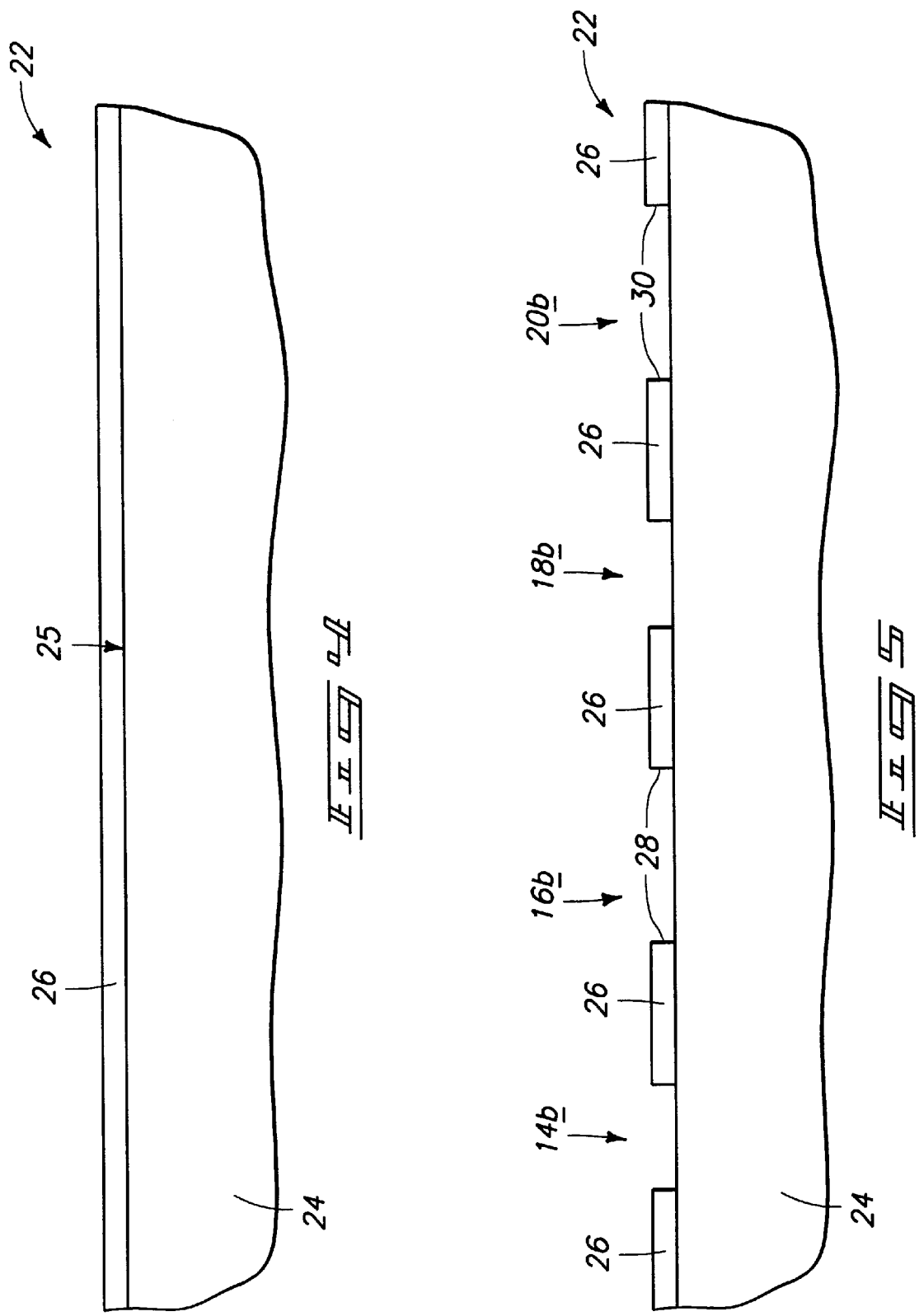

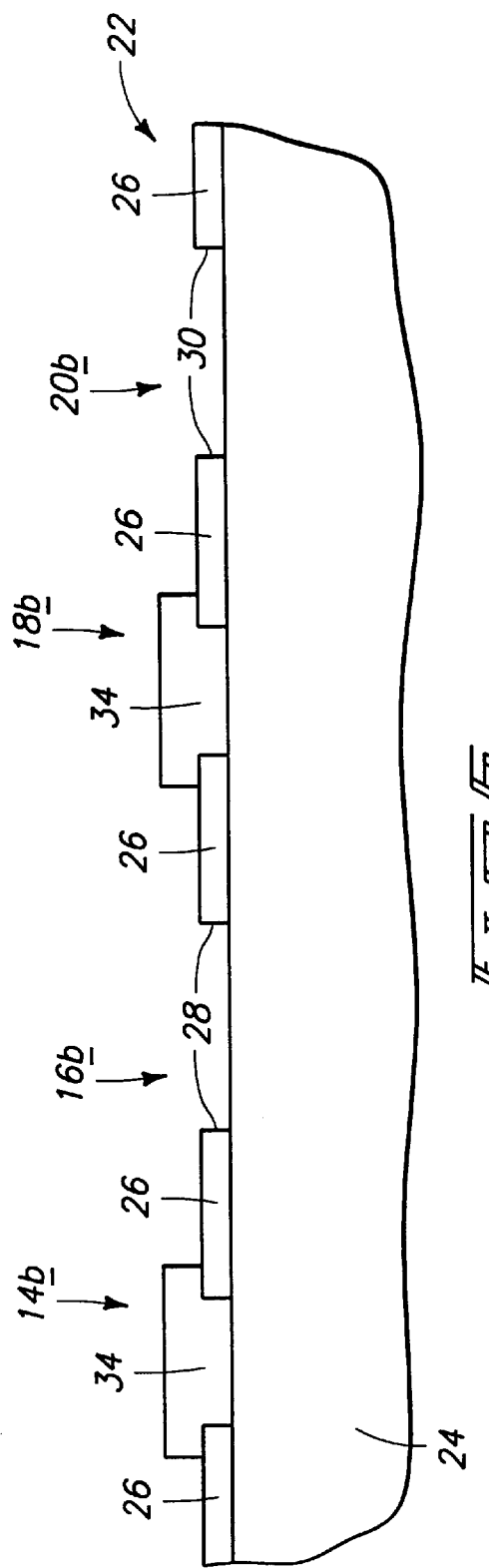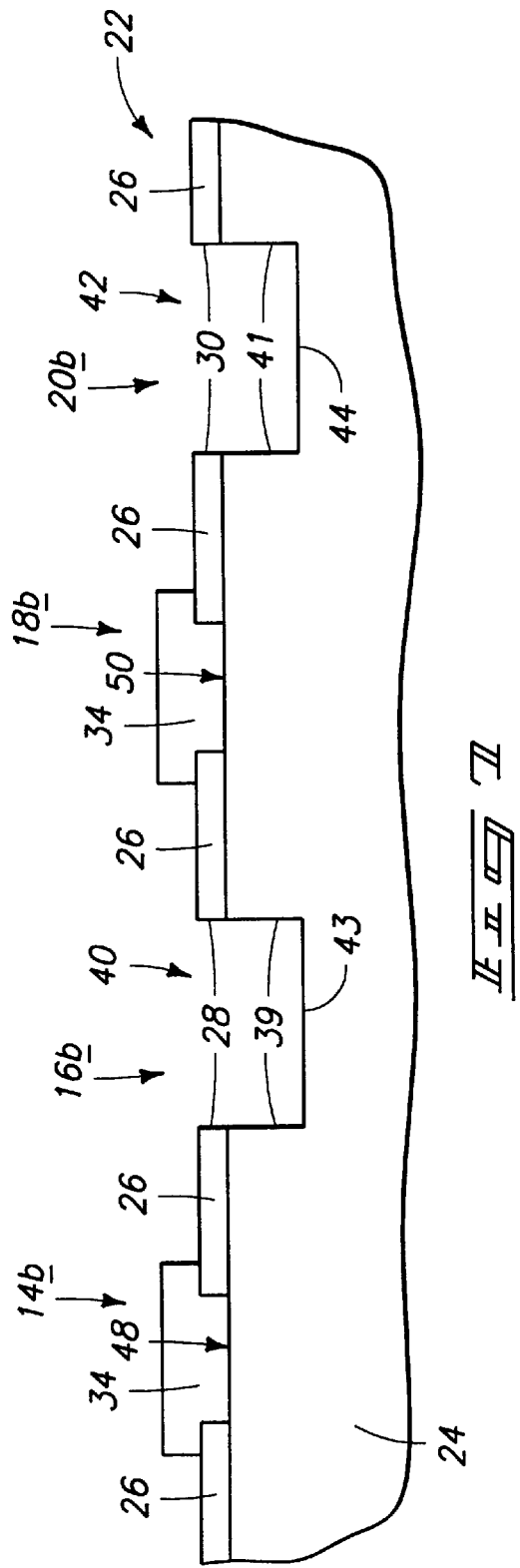

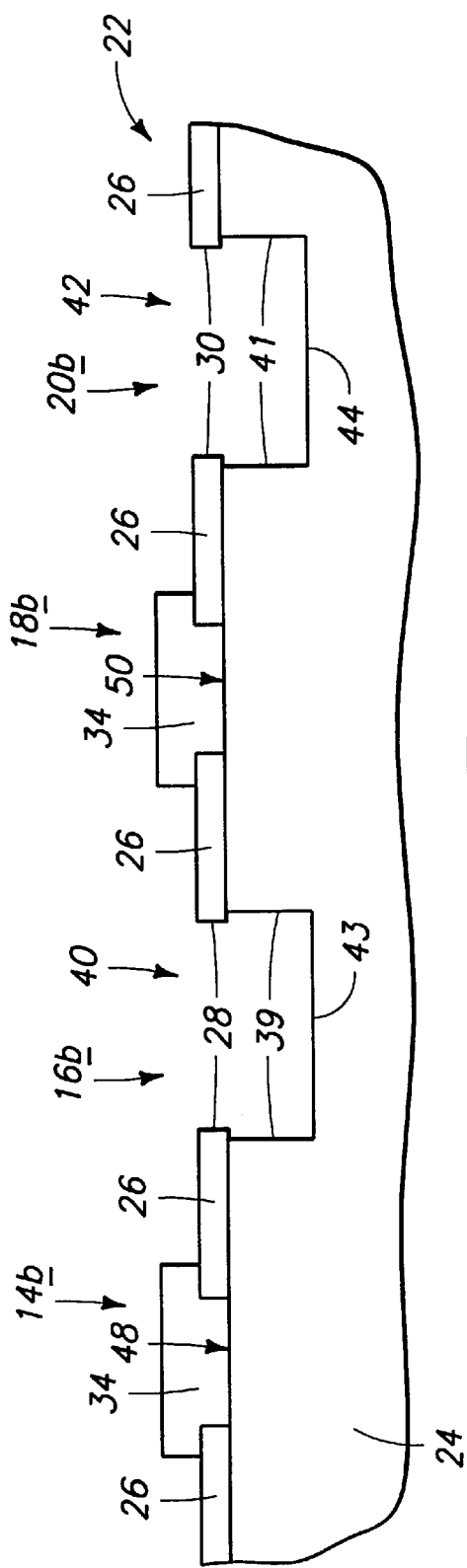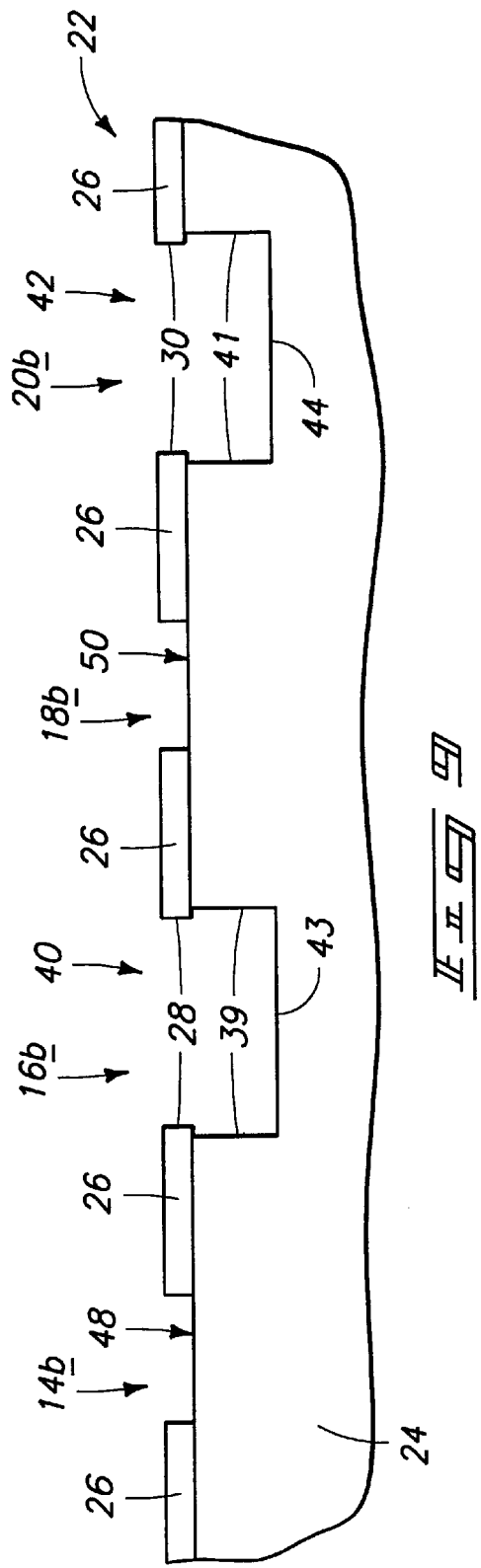

METHOD OF FORMING AN ALTERNATING PHASE SHIFT CIRCUITRY FABRICATION MASK, METHOD OF FORMING A CIRCUITRY FABRICATION MASK HAVING A SUBTRACTIVE ALTERNATING PHASE SHIFT REGION, AND ALTERNATING PHASE SHIFT MASK

TECHNICAL FIELD

This invention relates generally to methods of forming alternating phase shift circuitry fabrication masks, to methods of forming circuitry fabrication masks having a subtractive alternating phase shift region, and to alternating phase shift masks.

BACKGROUND OF THE INVENTION

In semiconductor manufacturing, photolithography is typically used in the formation of integrated circuits on a semiconductor wafer. During a lithographic process, a form of radiant energy such as ultraviolet light or electron beam is passed through a mask/reticle and onto the semiconductor wafer. The mask contains light restricting regions (for example totally opaque or attenuated/half-tone) and light transmissive regions (for example totally transparent) formed in a predetermined pattern. A grating pattern, for example, may be used to define parallel-spaced conductive lines on a semiconductor wafer.

The wafer is provided with a layer of energy sensitive resist material, for example photosensitive material commonly referred to as photoresist. Ultraviolet light passed through the mask onto the layer of photoresist transfers the mask pattern therein. The photoresist is then developed to remove either the exposed portions for a positive resist or the unexposed portions for a negative resist. The remaining patterned resist can then be used as a mask on the wafer during a subsequent semiconductor fabrication step, such as ion implantation or etching relative to layers on the wafer beneath the resist.

Advances in semiconductor integrated circuit performance have typically been accompanied by a simultaneous decrease in integrated circuit device dimensions and in the dimensions of conductor elements which connect those integrated circuit devices. The wavelength of coherent light employed in photolithographic processes by which integrated circuit devices and conductors are formed has typically desirably been smaller than the minimum dimensions within the reticle or mask through which those integrated circuit devices and elements are printed. At some point, the dimension of the smallest feature opening within the reticle approaches the wavelength of coherent light to be employed. Unfortunately, the resolution, exposure latitude and depth of focus in using such reticles and light decreases due to aberrational effects of coherent light passing through openings of width similar to the wavelength of the coherent light. Accordingly as semiconductor technology has advanced, there has traditionally been a corresponding decrease in wavelength of light employed in printing the features of circuitry.

One approach for providing high resolution printed integrated circuit devices of dimensions similar to the wavelength of coherent light utilized employs phase shift masks or reticles. In comparison with conventional reticles, phase shift masks typically incorporate alternating thicker and thinner transparent regions within the conventional chromium metal-on-glass reticle construction. These shifter regions are designed to produce a light transmissive substrate thickness related to the wavelength of coherent light passing through the phase shift mask. Specifically, coherent light rays passing through the light transmissive substrate and the shifter regions have different optical path lengths, and thus emerge from those surfaces with different phases. By providing light transmissive shifter regions to occupy alternating light transmitting regions of the patterned metal layer of a conventional phase shift mask of the Levenson type, adjacent bright areas are formed preferably 180° out-of-phase with one another. The interference effects of the coherent light rays of different phase provided by a phase shift mask form a higher resolution image when projected onto a semiconductor substrate, with accordingly a greater depth of focus and greater exposure latitude.

Where etching is used to form the alternating phase shift regions, unfortunately, such etched spaces transmit less light than adjacent unetched spaces due to total internal reflection along the sidewalls. Accordingly, the resultant image can consist of unevenly spaced lines/devices inspite of equal spacing on the mask.

A number of different techniques have been proposed to balance the transmission of etched versus adjacent unetched spaces. Such include blanket wet etching the entire reticle to enlarge both the etched and unetched spaces to undercut the chrome layer as well as widen the base of the quartz material. Unfortunately, isotropically wet etching a reticle can create large masking layer overhangs.

Another method includes selectively wet etching just the phase shift regions while masking the non-shifted regions. Another method involves dry etching both shifted and non-shifted regions. Unfortunately, this can reduce the transmission of light passing through both the shifted and non-shifted regions, thus degrading the image quality.

Another method utilized in an effort to overcome the above-described problem is known as "data biasing". Here, the spacing on the mask between features is modified from that desired on the wafer such that the resultant desired intensity is achieved on the wafer and thereby the desired circuitry pattern is created. Yet, circuitry designs are typically only biased in increments and not to dimensions between the increments. Accordingly, designs typically need to "snap" to a grid in order for the geometries to be defined. For instance, a polygon can be defined by sets of coordinates located on a grid. As the grid shrinks, the polygon can be defined more precisely thus increasing the resolution of the design. However, the amount of data defining the design can, and usually does, increase as well. Yet it is desirable to keep data file size to a minimum to minimize subsequent problems, such as computers running out of memory while manipulating them.

For example, engineers typically first define the grid in the design software or CAD program. One common CAD program is Design Framework II (DF2) sold by Cadence Design Systems, Inc. of Sunnyvale, Calif. and an example typical grid size is 0.05 um drawn which translates to 0.02 um for a 4x reticle. Physical verification programs, such as Design Rule Checkers (DRC's) and Optical Proximity Correction (OPC) also use grids, usually the same size as the original layout. For example, Mentor Graphics of Wilsonville, Oreg. sells DRC and OPCprograms, both under the name Calibre. Also, tools which convert the data from a CAD format to write tool formats, commonly referred to as fracturing, obey grid constraints. An example common fracture program is Computer Aided Transcription Software (CATS) sold by Transcription Enterprises Limited of Los Gatos, Calif. Then finally, reticle write tools accept the data with the predetermined grid. However, today's write tools also typically have a finite resolution which means that they are only capable of writing patterns at specified minimum grid sizes. For example, a writing tool may be able to resolve the spacing of 0.9 micron, 0.94 micron and 0.98 micron, but not be able to resolve between any of these values. Accordingly, the data with the predetermined grid also should fall within the resolution specification of the tool. So, designers choose grid sizes that compromise between design resolution and data file sizes, while not exceeding the manufacturing capability of the write tool. Yet, if the data biasing simulation software or other empirical data directs the biasing to be, for example, 0.92 micron to achieve resultant circuit resolution of 0.94, the particular writing tool is not able to create the desired 0.92 value on the mask.

Example prior art alternating phase shift mask fabrication techniques and masks are described in Uwe A. Griesinger et al., *Transmission & Phase Balancing of Alternating Phase Shifting Masks (5×)—Theoretical & Experimental Results*, SPIE99 #3873-36, pp. 1–11; and in Christophe Pierrat et al., *Phase-Shifting Mask Topography Effects on Lithographic Image Quality*, SPIE Vol. 1927 Optical/Laser Microlithography VI (1993), pp. 28–41.

SUMMARY

The invention comprises methods of forming alternating phase shift circuitry fabrication masks, methods of forming circuitry fabrication masks having a subtractive alternating phase shift region, and alternating phase shift masks. In one implementation, a method of forming an alternating phase shift circuitry fabrication mask incudes combining circuitry pattern is data biasing and wet undercut etching of light transmissive substrate material adjacent phase shift regions of the mask in fabricating the mask.

In one implementation, a method of forming an alternating phase shift circuitry fabrication mask includes combining circuitry pattern data biasing and wet undercut etching of light transmissive substrate material adjacent phase shift regions of the mask effective to achieve a first data biased pattern when using the mask to fabricate circuitry of a desired circuit pattern on another substrate. The first data biased pattern has at least some first resolution spacing falling between a discrete finite resolution spacing of which a writing tool used to fabricate the mask is capable of achieving.

BRIEF DESCRIPTION OF THE DRAWINGS

Preferred embodiments of the invention are described below with reference to the following accompanying drawings.

FIG. 1 is a diagrammatic view of a portion of a desired circuit pattern to be fabricated.

FIG. 2 is a diagrammatic depiction of a first data biased circuit pattern derived from the desired circuit pattern of FIG. 1.

FIG. 3 is a diagrammatic representation of a second data biased circuit pattern derived from the first data biased circuit pattern of FIG. 2.

FIG. 4 is a diagrammatic sectional view of an alternating phase shift mask in process, to be fabricated using the second data biased circuit pattern of FIG. 3.

FIG. 5 is a view of the FIG. 4 mask at a processing step subsequent to that depicted by FIG. 4.

FIG. 6 is a view of the FIG. 4 mask at a processing step subsequent to that depicted by FIG. 5.

FIG. 7 is a view of the FIG. 4 mask at a processing step subsequent to that depicted by FIG. 6.

FIG. 8 is a view of the FIG. 4 mask at a processing step subsequent to that depicted by FIG. 7.

FIG. 9 is a view of the FIG. 4 mask at a processing step subsequent to that depicted by FIG. 8.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A preferred method of forming a circuitry fabrication mask having a subtractive alternating phase shift region is described with reference to FIGS. 1–8. FIG. 1 depicts a portion of a desired circuit pattern 12 which is desired to be fabricated on a substrate using a mask such as described in the fabrication steps below. The method involves first determining some desired circuit pattern, such as the exemplary FIG. 1 pattern 12. For simplicity, such is shown to comprise equally spaced feature openings 14, 16, 18 and 20 of the same size and shape in the depicted cross-section. In accordance with the continuing discussion, the desired circuit pattern comprises some "adjacent" features, such as 14/16, 16/18 and 18/20. The mask to be fabricated is typically formed utilizing some mask writing tool which is capable of producing at least first and second discrete finite resolution spacings, but which is incapable of producing a discrete finite resolution spacing between the first and second resolution spacings. An example writing tool comprises the ETEC MEBES 4500, available from ETEC Systems, Inc, of Hillsboro, Oreg. By way of example only, such a tool is capable of producing finite resolution spacings between adjacent features of 0.38 micron, 0.40 micron, and 0.42 micron. However, the exemplary tool is not capable of producing resolution spacings between any of these values.

The invention includes data biasing a determined desired circuit pattern. The data biasing might be done empirically, by trial and error, by using commercially available software such as Tempest available from Panoramic Technology of Berkeley, Calif., using other software, or by some combination of these. All of this by itself could constitute prior art methods, or yet to be developed methods for data biasing. In one implementation, an initial data bias circuit pattern to be used in forming the ultimate desired circuit pattern on some substrate may, at least initially, dictate a data bias pattern having at least some first resolution spacing which falls between the first and second resolution spacings of which the particular writing tool to be used is capable. Accordingly, using such a writing tool, it would not be possible to create such a pattern on a substrate to be used in forming that mask.

FIG. 2 depicts an exemplary first data biased pattern 12a which is derived by data biasing the desired circuit pattern of FIG. 1. Such provides exemplary alternating opening spacings 14a, 16a, 18a, and 20a which go larger and smaller from that depicted in FIG. 1, as exemplified by the illustrated vertical dashed lines taken from FIG. 1, and in this one implementation which the writing tool is not capable of resolving or otherwise fabricating.

Referring to FIG. 3, the first data biased pattern of FIG. 2 has been used to derive a second data biased pattern 12b to change the first resolution spacing to some second resolution spacing equaling one of the first and second discrete finite resolution spacings of which the writing tool is capable. Accordingly, the dimensions of the depicted feature openings in FIG. 3 are slightly different than that depicted in FIG. 2, and within the capabilities of the writing tool to be used in mask fabrication in accordance with this but one exemplary aspect of the invention. In the depicted example, this collective data biasing of the circuit pattern of FIG. 1 derives a data biased pattern 12b having first alternating features of 16b and 20b of the circuitry which are larger than the respective features which will be fabricated on the substrate. Data bias pattern 12b also has at least some second alternating features 14b and 18b, with the first features 16b and 20b alternating with the second features 14b and 18b. Again, in this example, the goal (perhaps not 100% achievable) is to fabricate circuitry having the exact pattern represented by openings 14, 16, 18 and 20 of the FIG. 1 desired circuit pattern.

The data biasing in this implementation might fabricate openings 14b and 18b to not be data biased to be different in size than the respective features to be fabricated therewith on another substrate using the mask. Alternately, second mask openings 14b and 18b might be fabricated to be different in size (either smaller or larger) than the respective features to be fabricated therewith on the another substrate using the mask. In the depicted example, openings 14b and 18b are shown to be slightly smaller than the desired openings 14 and 18 of the circuitry pattern of FIG. 1.

FIG. 4 depicts a substrate 22 from which a circuitry fabrication mask having a subtractive alternating phase shift region is to be patterned. Substrate 22 comprises some suitable light transmissive substrate 24, preferably transparent. Light transmissive substrate 24 has an outer surface 25, with outer surface 25 preferably being globally planar, as shown. A light shielding layer 26 is formed over substrate 24 on surface 25. An example material for 24 is glass, such as quartz, at an exemplary thickness of 0.25 inch. An example for layer 26 is metal, such as chromium, deposited to an exemplary thickness of 1000 Angstroms. In the context of this document, the term "layer" includes both the singular and plural. Accordingly, layer 26 might constitute one or more materials or discrete layers.

Referring to FIG. 5, the data biased pattern of FIG. 3 is formed into light shielding layer 26 to include forming the alternating first mask openings 16b and 20b and the alternating second mask openings 14b and 18b therein. Accordingly, openings 14b, 16b, 18b and 20b in light shielding layer 26 of FIG. 5 are intended to be the same as the derived second data bias pattern of FIG. 3. For purposes of the continuing discussion, the first series of openings 16b and 20b can be considered as respectively comprising opposing sidewalls 28 and 30.

Referring to FIG. 6, second mask openings 14b and 18b are masked, preferably with a masking material 34, such as resist, while leaving first mask openings 16b and 20b and light shielding layer 26 exposed.

Referring to FIG. 7, light transmissive substrate 24 is anisotropically etched to at least partially form alternating phase shift regions 40 and 42 through first openings 16b and 20b as compared to the masked alternating second openings 14b and 18b. For purposes of the continuing discussion, regions 40 and 42 have sidewalls 39 and 41 respectively, and bases 43 and 44 respectively. An example preferred dry etch chemistry includes $CHF_3$ for both reactive ion etching and inductively coupled plasma etching. The depth of the etch is preferably chosen to provide close to the desired degree of phase shift ultimately of 180° between adjacent mask openings. Typical etching times to achieve near 180° phase shift in the ultimate mask are from three to five minutes. The subject etching might be conducted in a single etching step, or in multiple etching steps, for example with each one achieving approximately light transmissive substrate removal equal to about 60° phase shift.

Referring to FIG. 8, and while the second mask openings 14b and 18b are masked and the first masked openings 16b and 20b and the light shielding layer are exposed, light transmissive substrate 24 is wet etched through first openings 16b and 20b effective to undercut at least some of light shielding layer 26 proximate first mask openings 16b and 20b to a degree effective to achieve the first data biased pattern when subsequently using the mask to fabricate circuitry of the desired circuit pattern of FIG. 1 on another substrate. Accordingly in the preferred implementation, FIG. 2 is realized utilizing the FIG. 3 data biased pattern to achieve the FIG. 1 desired circuit pattern in the finished substrate.

In the described and preferred embodiment, masking material 34 remains on the substrate during both the dry and the wet etching, and without using other masking materials. Alternately, and by way of example only, the masking material might be removed intermediate the wet and dry etching to check the phase, and then preferably another layer of masking material provided before doing the subsequent etching. Also as shown, such wet etching preferably substantially uniformly undercuts light shielding layer 26 relative to the phase shift regions, as shown. Further preferably as shown and described, the dry etching is conducted prior to the wet etching, although the reverse might also be conducted but would be much less preferred.

An example chemistry for the wet etching includes diluted hydrofluoric acid or a buffered oxide hydrofluoric etch solution. Example conditions include 20° C. from anywhere from 25 to 70 seconds. The wet etching is preferably selected and designed to achieve the desired effect of deepening phase shift openings 40 and 42, by lowering bases 43 and 44, to achieve as close to the 180° phase shift as possible. Such further preferably moves sidewalls 39 and 41 laterally outward to be below and laterally recessed outwardly of sidewalls 28 and 30 of openings 16b and 20b in layer 26, preferably to a degree effective to achieve sufficient light transmission to achieve the ultimate desired circuit pattern of FIG. 1 when using the mask to fabricate circuitry. Further preferably as shown, second series of openings 14b define therethrough a series of respective exposed second light transmissive substrate bases 48 and 50 which are substantially coplanar with the light transmissive substrate outer surface 25 upon which light shielding layer 26 is proximately received.

Referring to FIG. 9, masking material 34 is ultimately removed.

Such provides but one example of a method of forming an alternating phase shift circuitry fabrication mask which comprises combining circuitry pattern data biasing with wet undercut etching of light transmissive substrate material adjacent phase shift regions of the mask effective to achieve a first data bias pattern when using the mask to fabricate the circuitry of a desired circuit pattern on another substrate. The first data bias pattern in such instance has at least some first resolution spacing falling between a discrete finite resolution spacing of which a writing tool used to fabricate the mask is capable of achieving. Such also provides one exemplary method where such is void of any undercut etching of the light transmissive substrate material adjacent the non-phase shift regions 14b and 18b of the mask.

Independent of writing tool resolution issues, the invention also contemplates a method of forming an alternating phase shift circuitry fabrication mask which comprises combining circuitry pattern data biasing and wet undercut etching of light transmissive substrate material adjacent phase shift regions of the mask in fabricating the mask, with the depicted embodiment as shown and described being but one example of achieving the same. The invention also contemplates alternating phase shift masks fabricated by the above and other methods.

By combining data bias and masked wet etching, the designer can have greater flexibility in achieving the desired circuitry layout on the circuit substrate to ultimately be fabricated. For example in one implementation, rather than maximizing the data biasing, the designer could use a smaller degree of data bias and greater degree of masked wet etching to balance the transmissions, which could be useful for very dense layouts. Also with the masked wet etch, the designer can control the phase shift as well, as it depends on the depth difference between the etched and unetched regions. Further the side effects of both data biasing and masked wet etching inherent in both can be reduced when they are used together.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an alternating phase shift circuitry fabrication mask comprising combining both circuitry pattern data biasing of a masking layer in its formation and then wet undercut etching of light transmissive substrate material adjacent phase shift regions of the mask in fabricating the mask, the data biasing comprising forming at least some openings in the masking layer to be larger than features to be fabricated therewith on a substrate using the mask.

2. A method of forming an alternating phase shift circuitry fabrication mask comprising combining both circuitry pattern data biasing of a masking layer in its formation and then wet undercut etching of light transmissive substrate material adjacent phase shift regions of the mask in fabricating the mask, the method being void of any undercut etching of the light transmissive substrate material beneath a masking layer adjacent non-phase shifted regions of the mask.

3. The method of claim 1 comprising dry etching the light transmissive substrate material to at least partially form the phase shift regions prior to the wet undercut etching.

4. A method of forming an alternating phase shift circuitry fabrication mask comprising:
  providing a mask writing tool capable of producing at least first and second discrete finite resolution spacings but incapable of producing a discrete finite resolution spacing between the first and second resolution spacings; and
  using said writing tool and combining both circuitry pattern data biasing of a masking layer in its formation and then wet undercut etching of light transmissive substrate material adjacent phase shift regions of the mask effective to achieve a first data biased pattern when using the mask to fabricate circuitry of a desired circuit pattern on another substrate, the first data biased pattern having at least some resolution spacing falling within said first and second resolution spacings of which the writing tool is incapable of producing.

5. The method of claim 4 being void of any undercut etching of the light transmissive substrate material adjacent non-phase shifted regions of the mask.

6. The method of claim 4 comprising dry etching the light transmissive substrate material to at least partially form the phase shift regions prior to the wet undercut etching.

7. A method of forming a circuitry fabrication mask having a subtractive alternating phase shift region, comprising:
  providing a light shielding layer over a light transmissive substrate;
  determining a desired circuit pattern to be fabricated on another substrate using the mask, the desired circuit pattern comprising two adjacent features;
  forming first and second adjacent openings into the light shielding layer configured to form the respective two adjacent features, one of the first and second adjacent openings being data biased to be larger than the feature to be fabricated therewith on the another substrate;
  masking the other of the first and second adjacent openings while leaving the one of the first and second openings outwardly exposed;
  while the other opening is masked and the one of the first and second openings is outwardly exposed, dry etching the light transmissive substrate to at least partially form a phase shift region through the one opening as compared to the masked adjacent other opening; and
  while the other opening is masked and the one of the first and second openings is outwardly exposed, wet etching the light transmissive substrate relative to the light shielding layer through the one opening effective to undercut at least some of the light shielding layer proximate the one opening.

8. The method of claim 7 wherein the other of the first and second adjacent openings is not data biased to be different in size than the feature to be fabricated therewith on the another substrate.

9. The method of claim 7 wherein the other of the first and second adjacent openings is data biased to be different in size than the feature to be fabricated therewith on the another substrate.

10. The method of claim 9 wherein the other of the first and second adjacent openings is data biased to be smaller in size than the feature to be fabricated therewith on the another substrate.

11. The method of claim 9 wherein the other of the first and second adjacent openings is data biased to be larger in size than the feature to be fabricated therewith on the another substrate.

12. The method of claim 7 wherein the light shielding layer comprises metal.

13. The method of claim 7 wherein the light transmissive substrate comprises quartz.

14. The method of claim 7 wherein the dry etching is conducted prior to the wet etching.

15. The method of claim 7 wherein the wet etching is conducted prior to the dry etching.

16. The method of claim 7 comprising unmasking the other opening intermediate the wet and dry etching and checking the phase intermediate the wet and dry etching.

17. The method of claim 7 wherein a masking material is utilized in the masking, the same masking material remaining on the substrate during both the dry etching and the wet etching.

18. The method of claim 7 wherein the wet etching substantially uniformly undercuts the light shielding layer.

19. A method of forming a circuitry fabrication mask having a subtractive alternating phase shift region, comprising:

providing a light shielding layer over a light transmissive substrate;

determining a desired circuit pattern to be fabricated on another substrate using the mask;

data biasing the circuit pattern to derive a data biased pattern having at least some first alternating features of the circuitry to have first mask openings which are larger than the respective features to be fabricated on the another substrate, and having at least some second alternating features of the circuitry to have second mask openings, the first mask openings alternating with the second mask openings;

forming the data biased pattern into the light shielding layer including forming the alternating first mask openings and the alternating second mask openings into the light shielding layer;

masking the second mask openings in the light shielding layer while leaving the first mask openings in the light shielding layer exposed;

while the second mask openings are masked and the first mask openings in the light shielding layer are exposed, dry etching the light transmissive substrate to at least partially form alternating phase shift regions through the first openings as compared to the masked alternating second openings; and while the second mask openings are masked and the first mask openings in the light shielding layer are exposed, wet etching the light transmissive substrate relative to the light shielding layer through the first openings effective to undercut at least some of the light shielding layer proximate the first mask openings.

20. The method of claim 19 wherein the second mask openings are not data biased to be different in size than the respective features to be fabricated therewith on the another substrate.

21. The method of claim 19 wherein the second mask openings are data biased to be different in size than the respective features to be fabricated therewith on the another substrate.

22. The method of claim 21 wherein the second mask openings are data biased to be smaller in size than the respective features to be fabricated therewith on the another substrate.

23. The method of claim 21 wherein the second mask openings are data biased to be larger in size than the respective features to be fabricated therewith on the another substrate.

24. The method of claim 19 wherein the dry etching is conducted prior to the wet etching.

25. The method of claim 19 wherein the wet etching is conducted prior to the dry etching.

26. The method of claim 19 wherein a masking material is utilized in the masking, the same masking material remaining on the substrate during both the dry etching and the wet etching.

27. The method of claim 19 comprising unmasking the second mask openings intermediate the wet and dry etching and checking the phase intermediate the wet and dry etching.

28. A method of forming a circuitry fabrication mask having a subtractive alternating phase shift region, comprising:

providing a light shielding layer over a light transmissive substrate;

determining a desired circuit pattern to be fabricated on another substrate using the mask;

providing a mask writing tool capable of producing at least first and second discrete finite resolution spacings but incapable of producing a discrete finite resolution spacing between the first and second resolution spacings;

data biasing the circuit pattern to derive a first data biased pattern having at least some first resolution spacing between the first and second resolution spacings;

deriving a second data biased pattern from the first data biased pattern to change the first resolution spacing to a second resolution spacing equaling one of the first and second discrete finite resolution spacings of which the writing tool is capable;

forming the second biased pattern into the light shielding layer, the second data bias pattern having at least some first alternating features having first mask openings which are larger than the respective circuitry features to be fabricated on the another substrate, and having at least some second alternating features of the circuitry to have second mask openings, the first mask openings alternating with the second mask openings;

masking the second mask openings in the light shielding layer while leaving the first mask openings in the light shielding layer exposed;

while the second mask openings are masked and the first mask openings in the light shielding layer are exposed, dry etching the light transmissive substrate to at least partially form alternating phase shift regions through the first openings as compared to the masked alternating second openings; and while the second mask openings are masked and the first mask openings in the light shielding layer are exposed, wet etching the light transmissive substrate through the first openings effective to undercut at least some of the light shielding layer proximate the first mask openings to a degree effective to achieve the first data biased pattern when using the mask to fabricate circuitry of the desired circuit pattern on another substrate.

29. The method of claim 28 wherein the second mask openings are data biased to be smaller in size than the respective features to be fabricated therewith on the another substrate.

30. The method of claim 28 wherein the second mask openings are data biased to be larger in size than the respective features to be fabricated therewith on the another substrate.

31. The method of claim 28 wherein the dry etching is conducted prior to the wet etching.

32. The method of claim 28 wherein the wet etching is conducted prior to the dry etching.

33. An alternating phase shift mask comprising:

a light transmissive substrate having an outer surface;

a light shielding layer received over the light transmissive substrate outer surface, the light shielding layer comprising a circuitry pattern at least a portion of which has a first series of openings therethrough which alternate with a second series of openings therethrough, at least the first series of openings being data biased to be larger than respective circuitry features to be fabricated on another substrate using the mask, the first series of openings respectively comprising opposing sidewalls;

subtractive phase shift opening regions in the light transmissive substrate aligned with the first series of openings, the phase shift opening regions respectively having opposing sidewalls which are below and laterally recessed outwardly of the respective sidewalls of the first series of openings in the light shielding layer in at least one cross section, the phase shift opening regions having respective bases; and the second series of openings defining therethrough a series of respective exposed second light transmissive substrate bases which are substantially coplanar with the light transmissive substrate outer surface upon which the light shielding layer is proximately received.

34. The alternating phase shift mask of claim 33 wherein the second series of circuit openings are not data biased to be different in size than the respective circuitry features to be fabricated therewith on the another substrate.

35. The alternating phase shift mask of claim 33 wherein the second series of circuit openings are data biased to be different in size than the respective circuitry features to be fabricated therewith on the another substrate.

36. The alternating phase shift mask of claim 35 wherein the second series of circuit openings are data biased to be smaller in size than the respective circuitry features to be fabricated therewith on the another substrate.

37. The alternating phase shift mask of claim 35 wherein the second series of circuit openings are data biased to be larger in size than the respective circuitry features to be fabricated therewith on the another substrate.

38. The alternating phase shift mask of claim 35 wherein the light shielding layer comprises metal.

39. The alternating phase shift mask of claim 35 wherein the light transmissive substrate comprises quartz.

40. The method of claim 1 wherein the data biasing also comprises forming at least some openings in the masking layer to be smaller than features to be fabricated therewith on the substrate using the mask.

41. The method of claim 1 being void of any undercut etching of the light transmissive substrate material adjacent non-phase shifted regions of the mask.

42. The method of claim 2 comprising dry etching the light transmissive substrate material to at least partially form the phase shift regions prior to the wet undercut etching.

43. A method of forming an alternating phase shift circuitry fabrication mask comprising combining both circuitry pattern data biasing of a masking layer in its formation and then wet undercut etching of light transmissive substrate material adjacent phase shift regions of the mask in fabricating the mask, the data biasing comprising forming at least some adjacent openings in the masking layer to be larger and smaller than features to be fabricated therewith on a substrate using the mask.

44. The method of claim 43 being void of any undercut etching of the light transmissive substrate material beneath the masking layer adjacent non-phase shifted regions of the mask.

45. The method of claim 43 comprising dry etching the light transmissive substrate material to at least partially form the phase shift regions prior to the wet undercut etching.

* * * * *

UNITED STATES PATENT AND TRADEMARK OFFICE
CERTIFICATE OF CORRECTION

PATENT NO. : 6,720,114 B1
DATED : April 13, 2004
INVENTOR(S) : Winder et al.

It is certified that error appears in the above-identified patent and that said Letters Patent is hereby corrected as shown below:

Column 3,
Line 33, replace "pattern is data biasing and wet undercut etching of light" with -- pattern data biasing and wet undercut etching of light --

Signed and Sealed this

Twenty-third Day of November, 2004

JON W. DUDAS
*Director of the United States Patent and Trademark Office*